(12) United States Patent
Maffitt et al.

(10) Patent No.: US 6,693,843 B1
(45) Date of Patent: Feb. 17, 2004

(54) WORDLINE ON AND OFF VOLTAGE COMPENSATION CIRCUIT BASED ON THE ARRAY DEVICE THRESHOLD VOLTAGE

(75) Inventors: Thomas M. Maffitt, Burlington, VT (US); Russell J. Houghton, Essex Junction, VT (US); Mark David Jacunski, Colchester, VT (US); William Robert Tonti, Essex Junction, VT (US); Kevin McStay, Hopewell Junction, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/318,795

(22) Filed: Dec. 13, 2002

(51) Int. Cl.$^7$ ................................. G11C 8/00
(52) U.S. Cl. ...................... 365/230.06; 365/189.09; 365/210; 365/226
(58) Field of Search .................. 365/230.06, 189.09, 365/226, 210

(56) References Cited

U.S. PATENT DOCUMENTS 6,377,508 B1 * 4/2002 Tomishima et al. .... 365/230.06
6,381,182 B1 * 4/2002 McStay ................. 365/189.09

* cited by examiner

*Primary Examiner*—Richard Elms
*Assistant Examiner*—Pho M. Luu
(74) *Attorney, Agent, or Firm*—F. Chau & Associates, LLP (57) ABSTRACT

An apparatus and method for wordline voltage compensation in integrated memories is provided, where the apparatus includes an array threshold voltage ($V_T$) monitor, a wordline on voltage ($V_{pp}$) generator in signal communication with the threshold voltage monitor for providing a wordline on voltage responsive to a change in the monitored array threshold voltage, and a wordline off voltage ($V_{WLL}$) generator in signal communication with the threshold voltage monitor for providing a wordline off voltage responsive to a change in the monitored array threshold voltage; and where the corresponding method for compensating each of a wordline on signal and a wordline off signal in correspondence with an array threshold signal includes monitoring an array threshold signal, generating a wordline on signal responsive to the monitored array threshold signal, and generating a wordline off signal responsive to the monitored array threshold signal.

12 Claims, 8 Drawing Sheets

WORDLINE ON AND OFF VOLTAGE COMPENSATION CIRCUIT BASED ON THE ARRAY DEVICE THRESHOLD VOLTAGE

BACKGROUND

The present disclosure relates to integrated memory circuits, and in particular, to an apparatus and method for wordline voltage compensation in integrated memory circuits.

In a typical computing system, a memory hierarchy supports a central processing unit ("CPU") with data storage capabilities. Generally, the type of memory device used as the primary random access memory ("RAM") in a computing system is dynamic random access memory ("DRAM"). DRAM is comparatively low in cost and high in density, facilitating the storage of large quantities of data within a small volume of the computing system.

Each DRAM is typically organized into memory arrays or banks, with each memory bank having a corresponding sense amplifier ("SA"). Data refresh is typically accomplished by accessing each row in each memory bank, one row at a time. When the memory banks are accessed to be refreshed, data stored in the memory cells of the banks are read to the sense amplifiers, and immediately written; back to the memory cells. A capacitor corresponding to each memory cell is thus recharged to its initial value.

Wordlines are used to access a memory cell within a row for refresh and non-refresh read and write operations. Generally in the design of DRAM, the magnitude of the wordline on or high voltage ("$V_{PP}$") is a major component of the rate with which charge is transferred into and out of the array storage cell in both the read and write modes of operation. This rate of charge transfer limits critical timing parameters such as write-back and the Row to Column delay ("$T_{rcd}$"), or, in the case of SDRAMs, the Open Bank to Read/Write Command. Thus, it is desirable to have this voltage be as high as the device reliability allows. The wordline off or low voltage ("$V_{WLL}$") is also a key parameter, strongly influencing the transfer device's off current ("$I_{OFF}$"), and as a consequence, cell retention time. In some DRAM designs, this is a negative voltage generated on the chip. For these designs it is desirable to make this voltage as negative as possible while not exceeding the maximum voltage stress that is the sum of the absolute values of the wordline off voltage and the wordline on voltage.

Traditionally, DRAMs have set the wordline on voltage as high as the reliability requirements will allow, thus generating the highest possible on current for signal development and write-back. However, this voltage does not track the array device threshold voltage ("$V_T$"), consequently the transfer device current will vary around its target, on some parts exceeding its target and on other parts falling short. In cases with the fixed wordline voltage approach of the prior art, the array transfer device on all parts is stressed at the maximum allowable voltage. In addition, power consumption to generate the wordline on voltage is fixed at a maximum by the high wordline voltage ("$V_{PP}$").

On some contemporary DRAM designs, the introduction of a negative wordline off voltage creates an analogous situation to the wordline on voltage. For these designs, the value of the wordline off voltage is chosen to set the desired $I_{off}$ current under worst-case process conditions. As with the wordline on voltage, the wordline off voltage does not track the array devices $V_T$, consequently $I_{off}$ current will exceed or fall short of a worst-case goal. The voltage stress level and power requirements are also fixed at a maximum expectable level.

For example, the maximum nominal wordline off voltage may be −0.5 v and the on voltage 2.6 v, giving a nominal maximum stress voltage of 3.1 v. It is desirable to increase the wordline on voltage (e.g., greater than 2.6 v) for performance and decrease the wordline off voltage (e.g., less than −0.5 v) for retention. However, since the maximum difference or delta is 3.1 v, both voltages cannot be increased simultaneously. Unfortunately, power supply references move such that $V_{PP}$ increases as $V_{WLL}$ increases in magnitude, and vise versa, thus increasing or decreasing the voltage swing while not closely tracking process variations that affect device on or off current. As a result, $V_{PP}$ and $V_{WLL}$ are moving independently of array $V_T$ and process variations, which causes the need for higher array device $I_{on}$ current and/or lower array device $I_{off}$ current.

SUMMARY

These and other drawbacks and disadvantages of the prior art are addressed by an apparatus and method for wordline voltage compensation in integrated memory circuits.

The apparatus is an integrated memory circuit including an array threshold voltage ("$V_T$") monitor, a wordline on voltage ("$V_{PP}$") generator in signal communication with the threshold voltage monitor for providing a wordline on voltage responsive to a change in the monitored array threshold voltage, and a wordline off voltage ("$V_{WLL}$") generator in signal communication with the threshold voltage monitor for providing a wordline off voltage responsive to a change in the monitored array threshold voltage.

The corresponding method for compensating each of a wordline on signal and a wordline off signal in correspondence with an array threshold signal includes monitoring an array threshold signal, generating a wordline on signal responsive to the monitored array threshold signal, and generating a wordline off signal responsive to the monitored array threshold signal.

These and other aspects, features and advantages of the present disclosure will become apparent from the following description of exemplary embodiments, which is to be read in connection with the accompanying drawings.

BRIEF DESCRIPTION OF THE DRAWINGS

The present disclosure teaches an apparatus and method for wordline voltage compensation in integrated memory circuits, in accordance with the following exemplary figures, in which.

DETAILED DESCRIPTION OF PREFERRED EMBODIMENTS

The present disclosure teaches a solution by which the array $V_T$ tracking circuit simultaneously adjusts the wordline on and off voltages based on the array device threshold. Since the magnitudes required for the wordline on and off voltages move opposite to the array device $V_T$, the magnitude between the wordline off and on voltages can remain fixed at the reliability maximum, while additional on current or less off current can be generated as required by the array devices' $V_T$ on a part by part basis. In this way, signal limited and write-back time yield is improved on parts with high array $V_T$, while retention time is improved on parts with low array $V_T$, without one requirement being sacrificing for the other. In both cases, the reliability requirements are met with minimum possible power consumption.

Accordingly, an apparatus and method are provided for wordline voltage compensation in integrated memory circuits, by which the wordline high voltage ("$V_{PP}$") and the wordline off voltage ("$V_{WLL}$") track the array device $V_T$, while maintaining a maximum voltage swing that is acceptable for reliability. Thus, when the array $V_T$ increases, $V_{PP}$ and $V_{WLL}$ both increase and compensate for lower $I_{on}$ device current while not exceeding the $I_{off}$ requirements, since the array $V_T$ is higher. In the opposite case, when the array $V_T$ decreases, $V_{PP}$ and $V_{WLL}$ both decrease and compensate for the higher $I_{off}$ current while not missing the $I_{on}$ current requirement, since the $V_T$ is lower.

In both cases, the voltage swing is held constant at the maximum delta that is allowed by the reliability specification. Both $V_{PP}$ and $V_{WLL}$ track the sub-threshold current of the monitor devices. As a consequence, when the array $V_T$ increases or decreases, $V_{PP}$ and $V_{WLL}$ also change, keeping the maximum $V_{PP}$ to $V_{WLL}$ swing constant, at 3.1 v in an exemplary embodiment.

In typical DRAMs, a number of memory cells can be attached to each bit line ("BL"), such as, for example, five hundred and twelve memory cells per BL. During a read and/or write operation, the dumping and/or charging of a logic "1" or logic "0" charge is accomplished from a single memory cell in correspondence with an addressing wordline.

Although exemplary embodiments are described in the present disclosure, specific structural and functional details disclosed herein are merely exemplary for purposes of describing preferred embodiments. Thus, it shall be understood that the presently disclosed concept of wordline voltage compensation can be applied to any integrated memory circuit, including DRAMs used in hierarchical memory systems.

Figure 1:
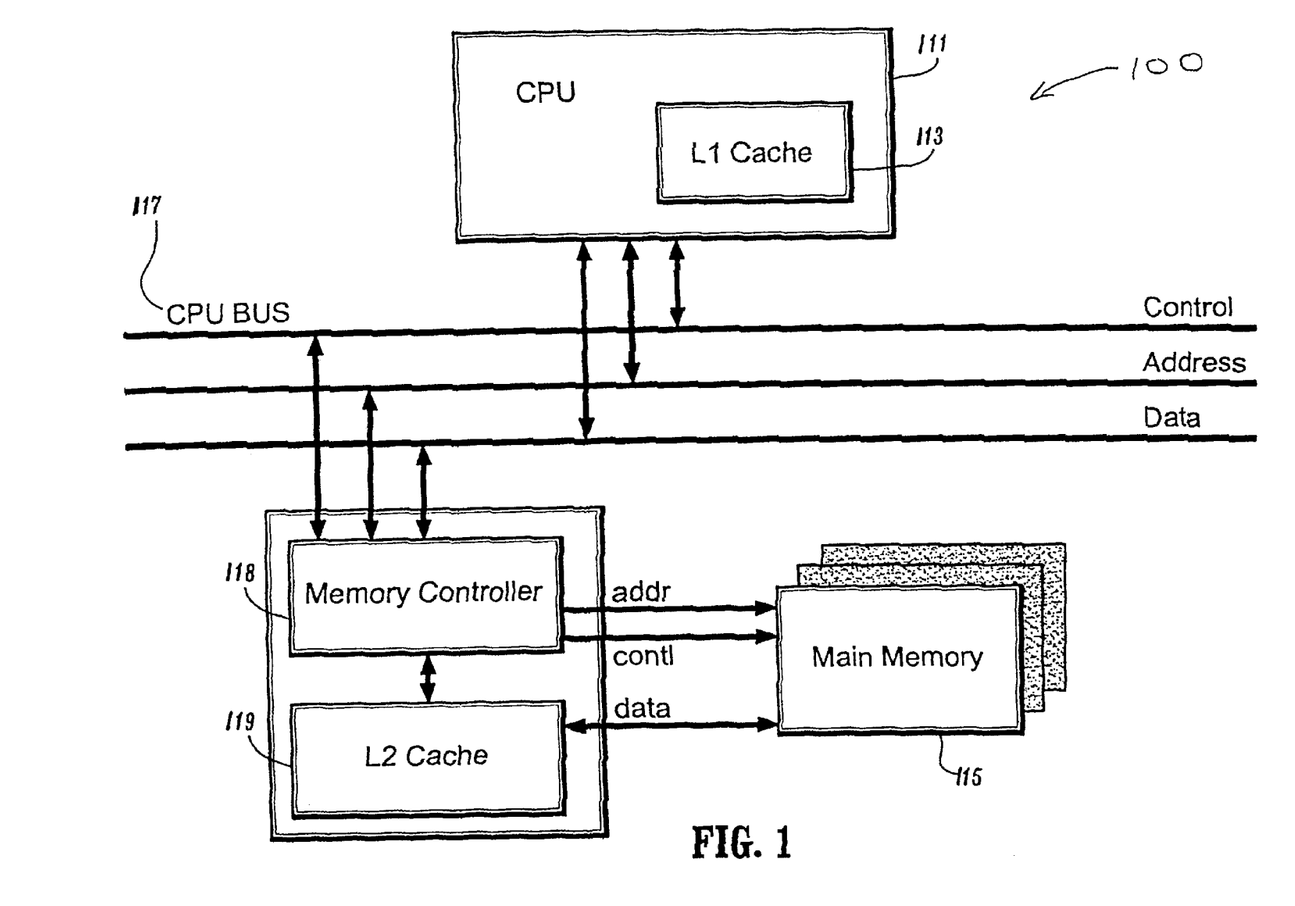
FIG. 1 shows a block diagram of a computing system with DRAM where exemplary embodiments of the present disclosure are applied.

As shown in FIG. 1, a memory organization for a computing system is generally indicated by the reference numeral 100. The computing system 100 includes a central processing unit ("CPU") 111 with an on-chip cache memory ("L1 cache") 113, a main memory 115, a CPU bus 117, a memory controller 118 for controlling data traffic on the CPU bus 117, and a second level cache memory ("L2 cache") 119.

The first level cache memory 113 is integrated on the same chip with the CPU 111. The first level cache memory 113 is typically faster because it is integrated with the CPU 111 with a higher bandwidth and shorter wire length and therefore avoids any delay associated with transmitting and/or receiving signals to and/or from an external chip. The second level cache memory 119 is located on a different chip than the CPU, and typically has a larger capacity than the first level cache memory 113 but smaller than a main memory 115.

The cache memories 113 and 119 serve as buffers between the CPU 111 and the main memory 115. The computing system preferably employs DRAM for at least the main memory 115, which therefore requires a data refresh process. Thus, a method of accessing and/or refreshing data according to the present invention is described with respect to the main memory 115. However, it shall be understood that the present invention is equally applicable to any DRAM memory, such as, for example, any DRAM memory used anywhere in a hierarchical memory system, including, for example, cache memories.

Figure 2:
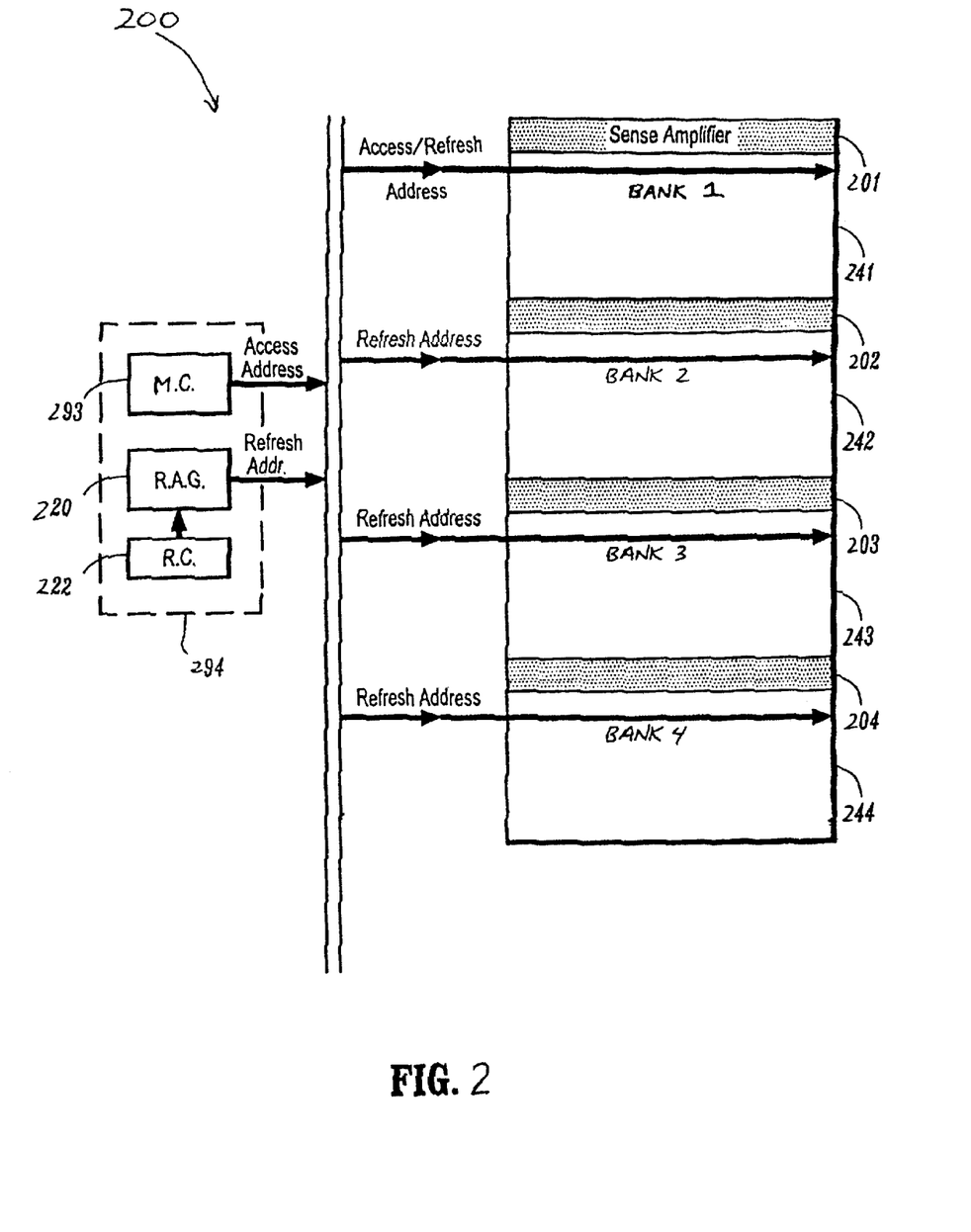
FIG. 2 shows a block diagram illustrating several memory banks of the DRAM of FIG. 1.

Referring to FIG. 2, the reference numeral 200 generally indicates a DRAM data memory with wordline addresses applied to the memory contents, such as, for example, a 256 MB SDRAM. The DRAM data memory 200 has multiple banks, 241, 242, 243 and 244, respectively, each bank having a corresponding sense amplifier, 201, 202, 203 and 204, respectively. Data stored in each of the banks may be accessed by a corresponding wordline address. Assuming that a wordline on which a read/write operation requested by the CPU 111 of FIG. 1 is to be performed is located in a first bank 241, the access address corresponding to the wordline is provided to the first bank 241. In a refresh mode of operation, the refresh address generator 220 generates refresh addresses to the banks 241–244, respectively. In the case of four banks 241–244, each bank is identified, for example, by two digits of a bank address to access any wordline in the bank. For example, the two digits of a bank address may be '00', '01', '10', or '11', which designate the first 241, second 242, third 243 or fourth bank 244, respectively.

A refresh address generator 220 preferably includes a refresh counter 222, which provides refresh timing and addresses of wordlines for all banks in which a refresh operation is to be performed. The refresh counter 222 is, for example, tracking the wordline addresses for each bank to be refreshed. When one wordline data address is refreshed, the refresh counter 222 generates the next address of the banks for refresh. When all the wordlines in the activated bank are refreshed, the refresh counter 222 is reset to zero and starts to refresh the first wordline again in the next refresh cycle.

Figure 3:
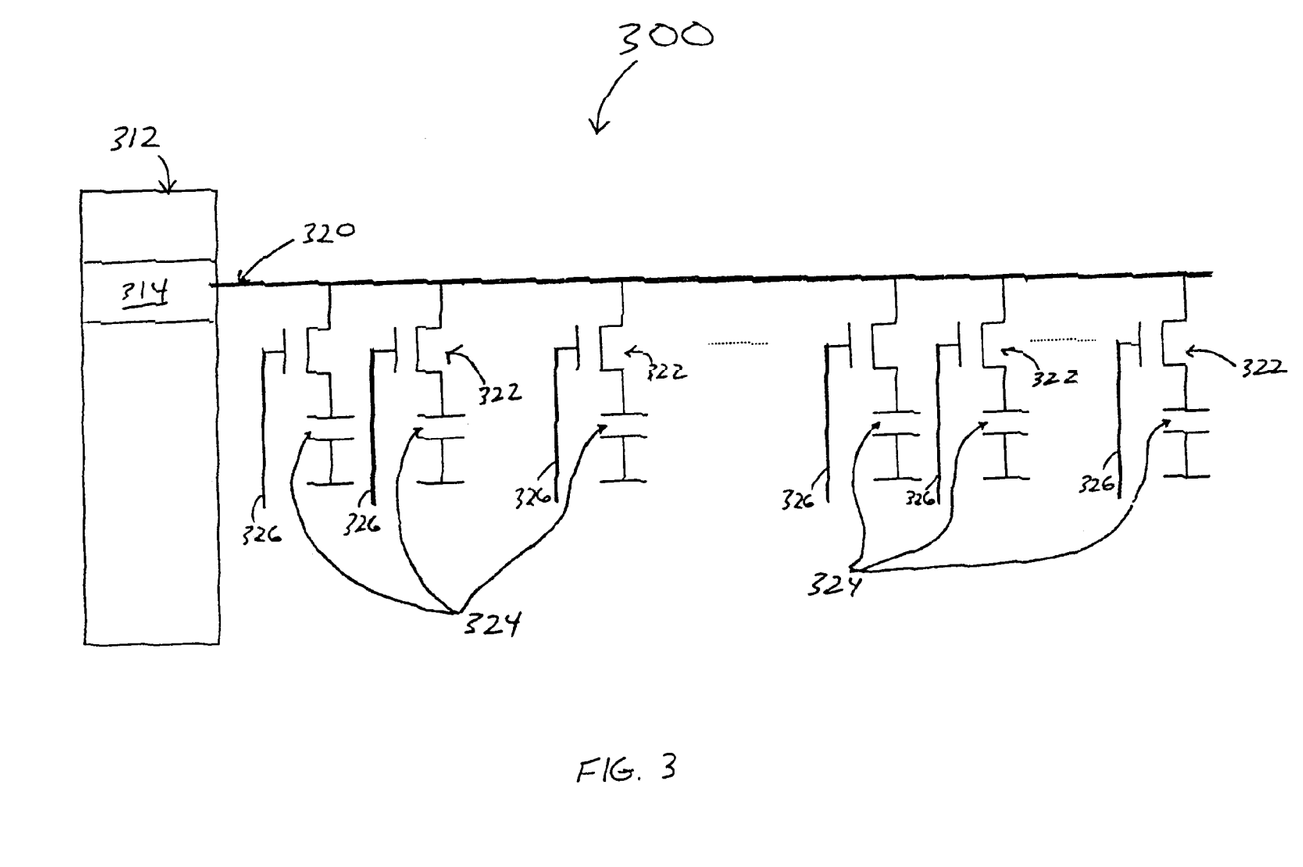
FIG. 3 shows a schematic diagram illustrating several memory cells of a memory array or bank of FIG. 2.

Turning to FIG. 3, a bank of DRAM is indicated generally by the reference numeral 300. The bank 300 includes a sense amplifier row 312 having a number of single sense amplifiers 314. A single sense amplifier 314 is in signal communication with a bit line 320 ("BL"). Each bit line 320 is in signal communication with a number of pass transistors or switches 322. Each pass transistor 322, in turn, is in signal communication with a corresponding memory cell capacitor 324. A wordline 326 is in signal communication with each pass transistor 322. In this exemplary embodiment, there are two hundred and fifty-six memory cells 324 and two hundred and fifty-six corresponding pass transistors 322 coupled in signal communication with each bit line 320. Although only the BL signal line is shown, the structure for the complimentary BL-BAR signal line is the same. For example, the memory cells 324 are shown only for the BL signal line, corresponding to even numbered wordlines, while the memory cells for the BL-BAR signal line, which is not shown, correspond to the odd numbered wordlines. Thus, the single sense amplifier 314 of this exemplary embodiment supports (256*2)=512 memory cells.

Figure 4:
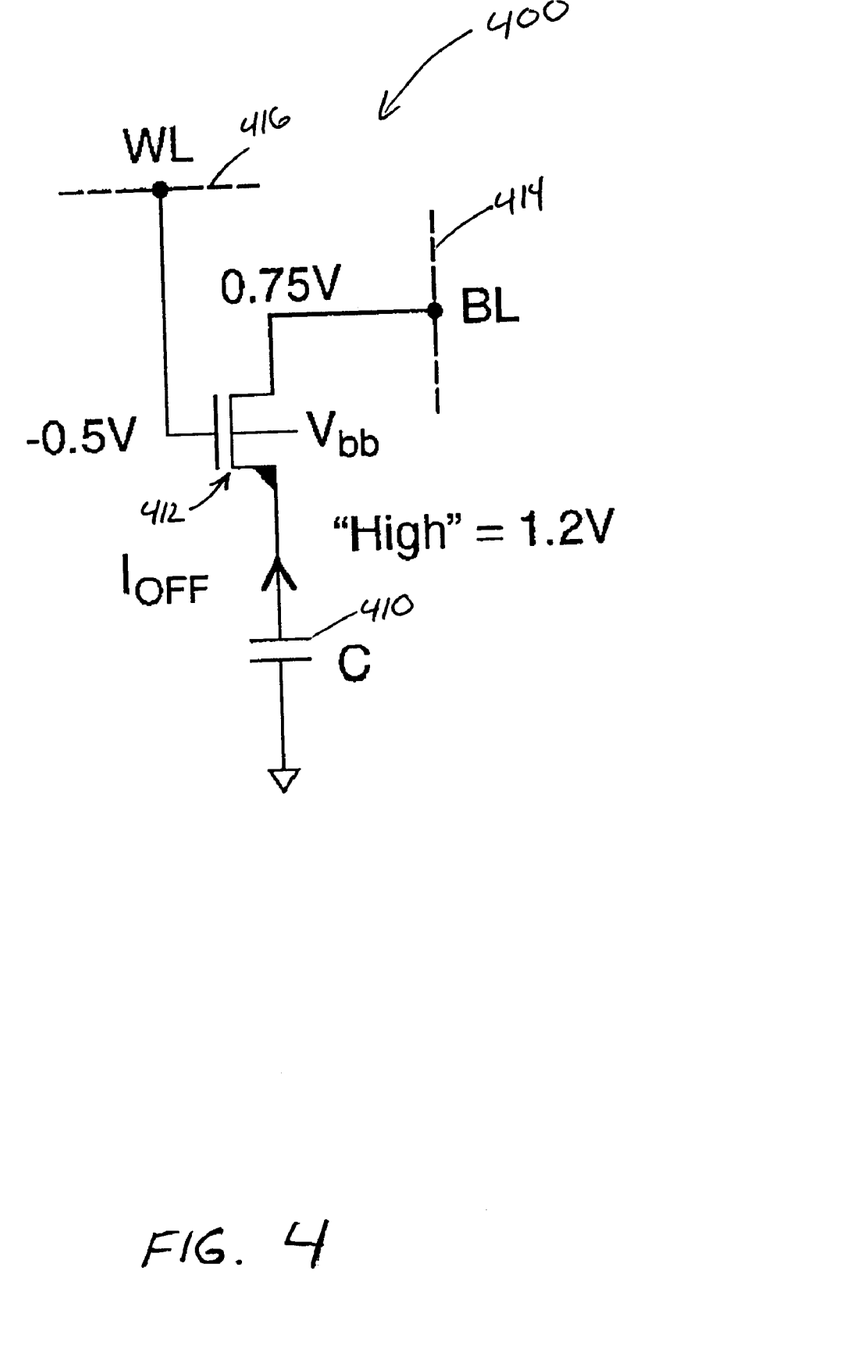
FIG. 4 shows a schematic diagram illustrating a memory cell of FIG. 3 in standby mode storing a "high" voltage.

Turning now to FIG. 4, a memory cell in a standby mode is indicated generally by the reference numeral 400. The exemplary cell 400 is storing a 1.2V "high" charge across its capacitor 410. A current $I_{OFF}$ flows from the capacitor 410 to a source terminal of a pass transistor 412. A substrate terminal of the transistor 412 receives a back-bias voltage $V_{bb}$. A drain terminal of the transistor 412 receives a 0.75V signal from a bitline ("BL") 414, and a gate terminal of the transistor 412 receives a −0.5V wordline off voltage or wordline low ("$V_{WLL}$") signal from a wordline ("WL") 416.

Figure 5:
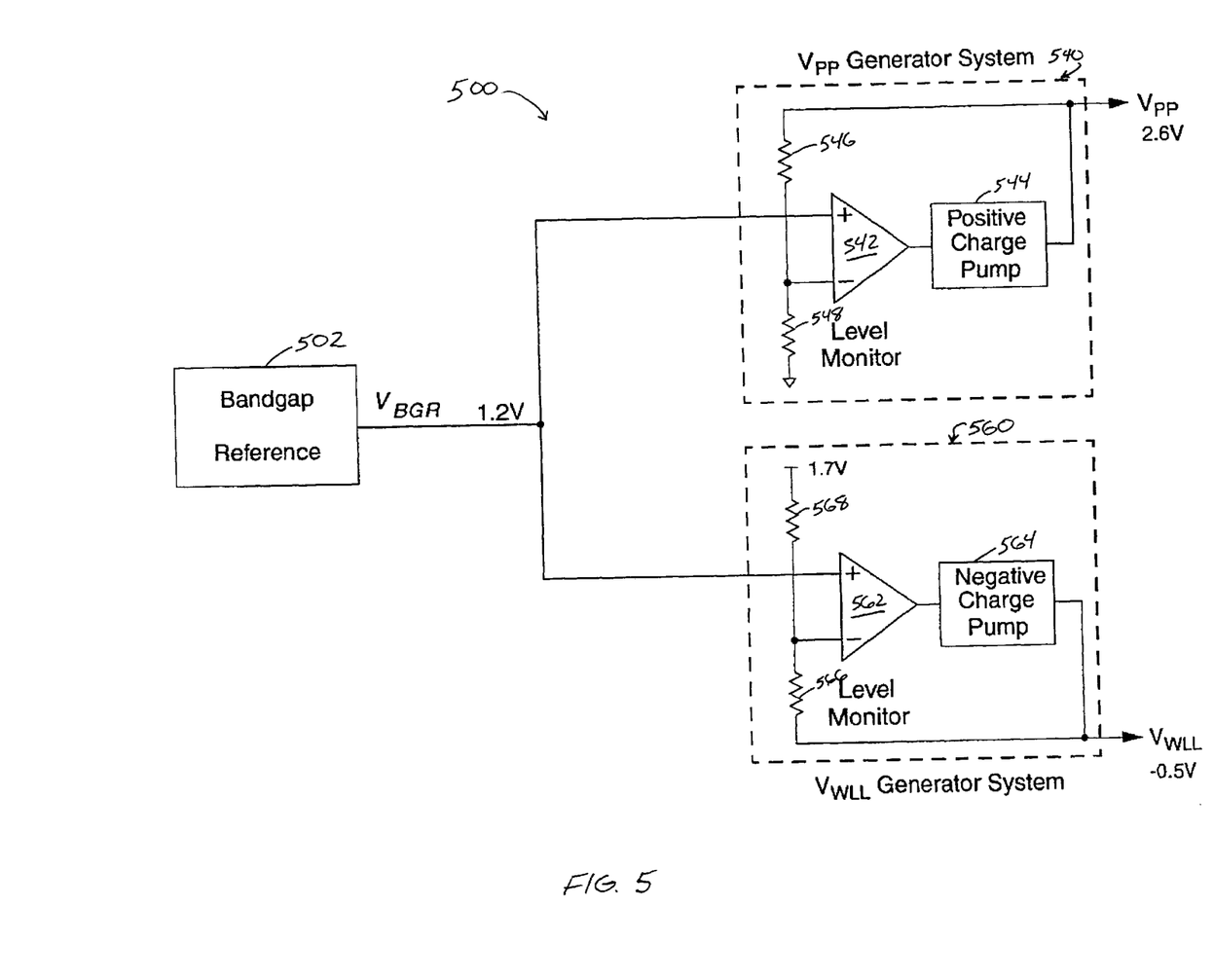
FIG. 5 shows a schematic diagram illustrating a prior art voltage generation system having a fixed reference voltage.

As shown in FIG. 5, a typical voltage generation system having a fixed reference voltage is indicated generally by the reference numeral 500. The system 500 includes a bandgap reference 502 for providing a bandgap reference voltage signal ("$V_{BGR}$") of 1.2V to a wordline on voltage ("$V_{pp}$") generator system 540 and to a wordline off voltage ("$V_{WLL}$") generator system 560. The $V_{pp}$ generator system 540 receives the $V_{BGR}$ signal on a non-inverting input of a differential amplifier level monitor 542. The output of the amplifier 542 is coupled in signal communication with a Positive Charge Pump 544. The output of the Positive Charge Pump 544 is tapped for the output $V_{pp}$ of 2.6 v, and is fed back to a resistor 546. The output of the resistor 546 is coupled to an inverting input of the amplifier 542, as well as to a resistor 548. The output of the resistor 548 is grounded.

The $V_{WLL}$ generator system 560 receives the $V_{BGR}$ signal on a non-inverting input of a differential amplifier level monitor 562. The output of the amplifier 562 is coupled in signal communication with a Negative Charge Pump 564. The output of the Negative Charge Pump 564 is tapped for the output $V_{WLL}$ of −0.5 v, and is fed back to a resistor 566. The output of the resistor 566 is coupled to an inverting input of the amplifier 562, as well as to a resistor 568. The output of the resistor 568 is coupled to a 1.7 v source.

Thus, this prior art system to generate the wordline "on" and "off" voltage sources $V_{PP}$ and $V_{WLL}$ uses a conventional bandgap reference circuit that outputs 1.2V supplies for the reference voltage to the level monitors. Based on practical design considerations, it is desired to preserve this 1.2V nominal reference when implementing the inventive compensation system of the present disclosure. In addition, the change in $V_T$ ("+/−$dV_{TA}$") fluctuation must be passed to $V_{PP}$ and $V_{WLL}$ without amplification or attenuation. The 1.2V $V_{PP}$ Reference Generator and the 1.2V $V_{WLL}$ Reference Generator in to be described provide level translation to 1.2V and scaling by the inverse of the generator system gain factor in each path in order to pass+/−$dV_{TA}$ to $V_{PP}$ and $V_{WLL}$, respectively.

Figure 6:
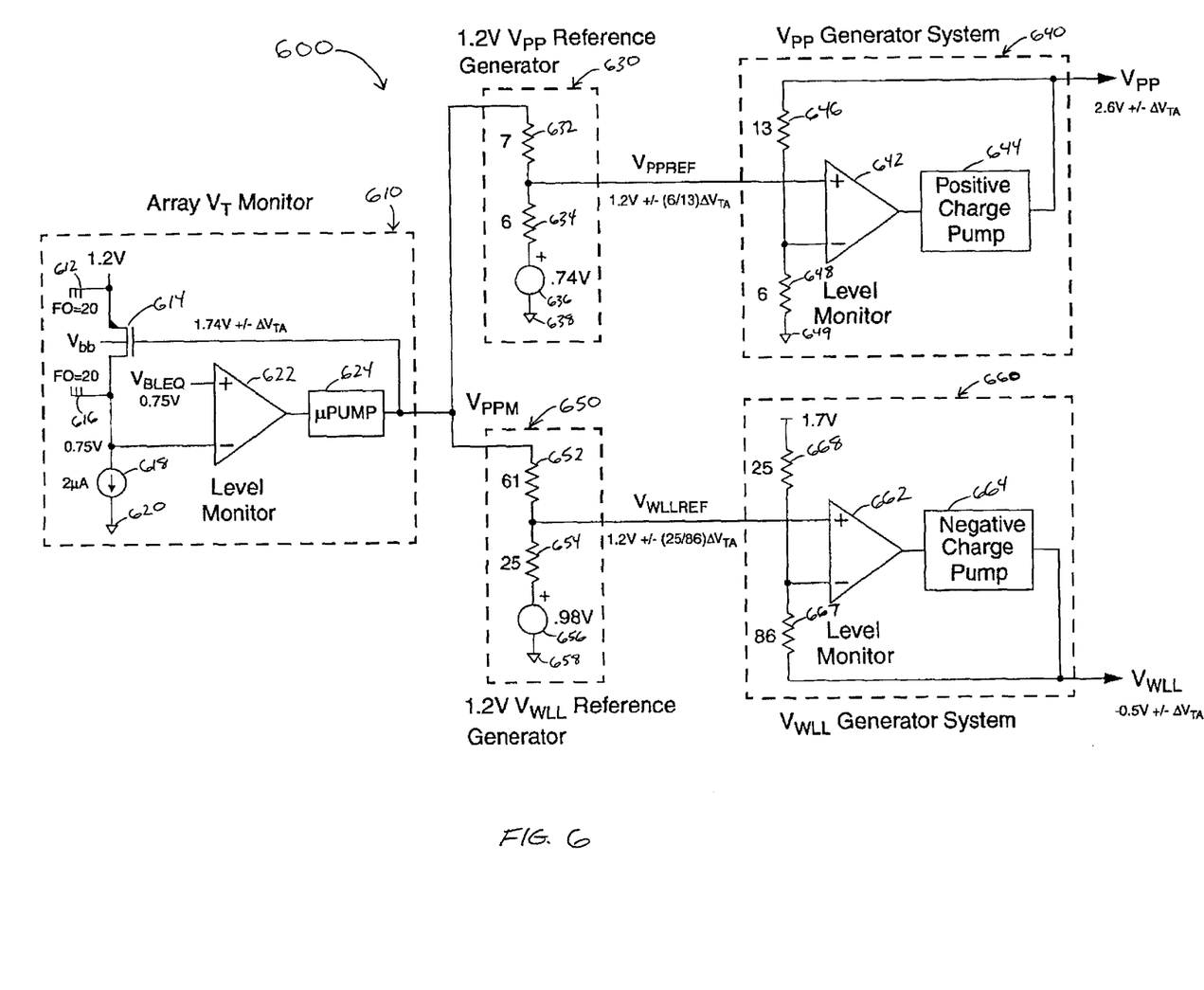
FIG. 6 shows a schematic diagram illustrating a voltage generation system having a compensated reference voltage according to an exemplary embodiment of the present disclosure.

Referring now to FIG. 6, a voltage generation system having a compensated reference voltage according to an exemplary embodiment of the present disclosure is indicated generally by the reference numeral 600. The compensated system 600 includes an array $V_T$ monitor 610 coupled to a 1.2 v $V_{PP}$ reference generator 630 and coupled to a 1.2V $V_{WLL}$ reference generator 650. The 1.2 v $V_{PP}$ reference generator 630 is coupled, in turn, to a $V_{PP}$ generator system 640, for producing a compensated $V_{PP}$ signal output. The 1.2 v $V_{WLL}$ reference generator 650 is coupled, in turn, to a $V_{WLL}$ generator system 660, for producing a compensated $V_{WLL}$ signal output.

The array $V_T$ monitor 610 includes a transistor 614 with the source terminal 612 connected to 1.2 v. A substrate terminal of the transistor 614 is coupled to $V_{bb}$, and a drain terminal of the transistor 614 is coupled to a terminal 616, an inverting input of a differential amplifier level monitor 622 at 0.75V, and the anode of a 2 microAmp current source 618. The transistor 614 includes 20 identical devices in parallel as shown in 610 as a fan out ("FO") of 20. The cathode of the current source 618 is coupled to a common return 620. A non-inverting input of the amplifier 622 is coupled to $V_{BLEQ}$ of 0.75V. The output of the amplifier 622 is coupled to a microampere charge pump ("uPUMP") 624, which is coupled to each of the gate terminal of the transistor 614 and the output of the array $V_T$ monitor 610, which, in turn, carries a signal representing 1.74V plus or minus delta $V_{TA}$, or "$V_{PPM}$".

The 1.2 v $V_{pp}$ reference generator 630 includes a resistor 632 of 7 relative resistance units (e.g., 7 K Ohms) coupled to the output of the array $V_T$ monitor 610. The output of the resistor 632, $V_{PPREF}$, is coupled to each of the output of the 1.2 v $V_{PP}$ reference generator 630 and another resistor 634 of 6 relative resistance units. The resistor 634, in turn, is coupled to the cathode of a 0.74V voltage source 636, where the anode is coupled to a common return 638. Thus, the output of the 1.2 v $V_{PP}$ reference generator 630, $V_{PPREF}$, carries a signal representing 1.2V plus or minus (6/13) times delta $V_{TA}$.

The $V_{PP}$ generator system 640 includes a differential amplifier level monitor 642 having a non-inverting input for receiving the $V_{PPREF}$ signal from the output of the 1.2 v $V_{PP}$ reference generator 630. The output of the amplifier 642 is coupled in signal communication with a Positive Charge Pump 644. The output of the Positive Charge Pump 644 is tapped for the output $V_{pp}$ signal of 2.6 v plus or minus delta $V_{TA}$, and is fed back to a resistor 646 of 13 relative resistance units. The output of the resistor 646 is coupled to an inverting input of the amplifier 642, as well as to a resistor 648 of 6 relative resistance units. The output of the resistor 648 is coupled to a common ground or return 649.

The 1.2 v $V_{WLL}$ reference generator 650 includes a resistor 652 of 61 relative resistance units (e.g., 61 K Ohms) coupled to the output of the array $V_T$ monitor 610. The output of the resistor 652, $V_{WLLREF}$, is coupled to each of the output of the 1.2 v $V_{WLL}$ reference generator 650 and another resistor 654 of 25 relative resistance units. The resistor 654, in turn, is coupled to the cathode of a 0.98V voltage source 656, where the anode is coupled to a common return 658. Thus, the output of the 1.2 v $V_{WLL}$ reference generator 650, $V_{WLLREF}$, carries a signal representing 1.2V plus or minus (25/86) times delta $V_{TA}$.

The $V_{WLL}$ generator system 660 includes a differential amplifier level monitor 662 having a non-inverting input for receiving the $V_{WLLREF}$ signal from the output of the 1.2 v $V_{WLL}$ reference generator 650. The output of the amplifier 662 is coupled in signal communication with a Positive Charge Pump 664. The output of the Positive Charge Pump 664 is tapped for the output $V_{WLL}$ signal of−0.5 v plus or minus delta $V_{TA}$, and is fed back to a resistor 667 of 86 relative resistance units. The output of the resistor 667 is coupled to an inverting input of the amplifier 662, as well as to a resistor 668 of 25 relative resistance units. The output of the resistor 668 is held to a voltage level of 1.7 v.

Thus, an exemplary circuit embodiment to implement the inventive array $V_T$ compensation method uses an Array $V_T$ Monitor with 20 array devices in parallel with the source, as well as drain and backgate applied voltages chosen to imitate the cell in standby storing a "high" level according to the conditions shown in FIG. 4. A feedback circuit including a level monitor and microampere charge pump ("uPUMP") regulates the monitor device gate voltage $V_{PPM}$ to support the 2 uA forced current. At this current each of the 20 devices operates in a sub-threshold mode where the gate voltage $V_{PPM}$ is expected to vary only with device $V_T$ fluctuations. A typical value of $V_{PPM}$ would be 1.74V and vary by +/–$dV_{TA}$, for example.

Figure 7:
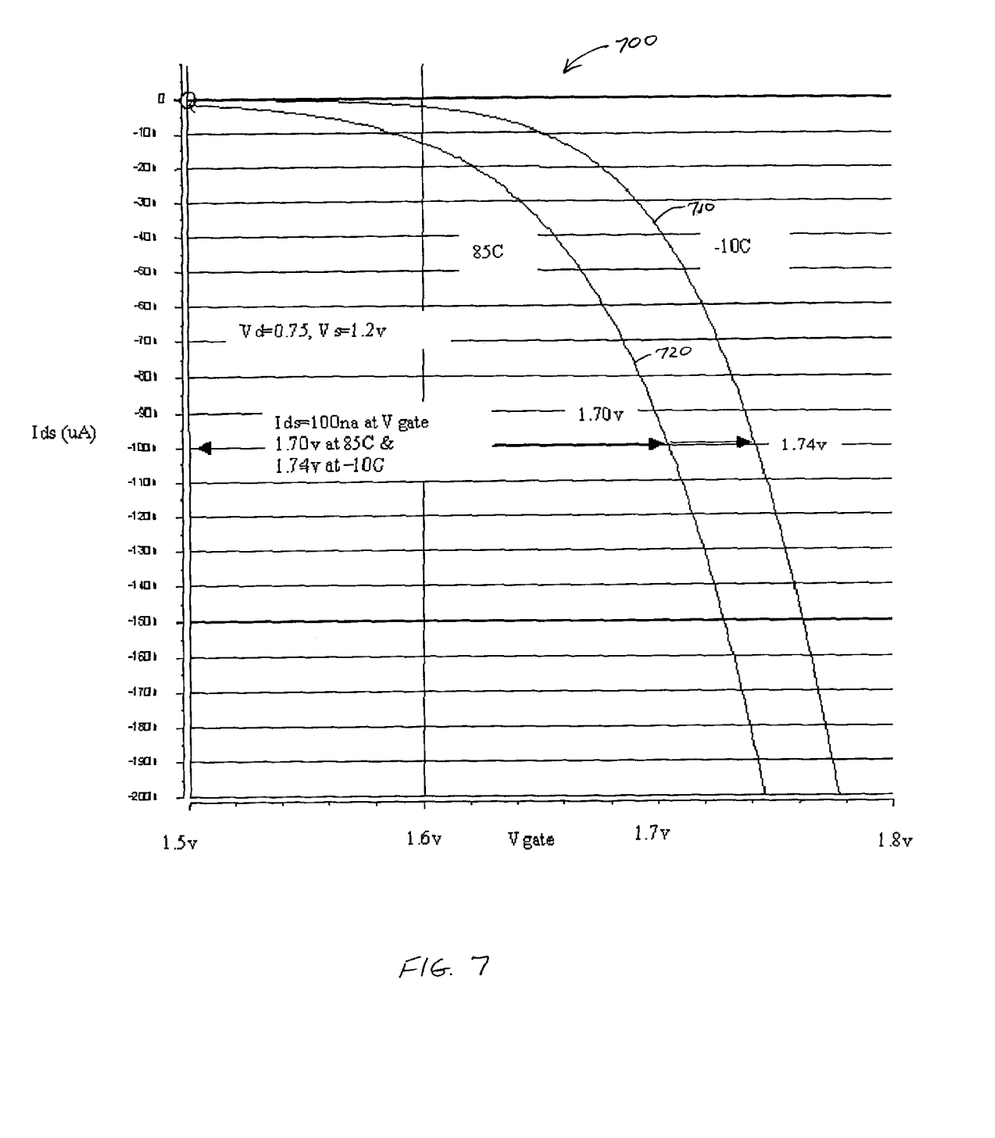
FIG. 7 shows plots of constant-temperature data for drain-to-source current versus gate voltage for a memory cell pass transistor.

Turning to FIG. 7, constant-temperature data for drain-to-source or array current ("Ids") versus gate voltage ("$V_{gate}$") for a memory cell pass transistor is indicated generally by the reference numeral 700. Here, the drain voltage ("$V_d$") is held at 0.75V, and the source voltage ("$V_s$") is held at 1.2V. A curve 710 indicates data for a temperature of –10 degrees Celsius, and a curve 720 indicates data for a temperature of +85 degrees Celsius. Thus, an $I_{ds}$ of 100nA corresponds to a $V_{gate}$ of 1.70 v at 85 degrees Celsius, but the same $I_{ds}$ of 100 nA corresponds to a $V_{gate}$ of 1.74 v at minus 10 degrees Celsius. Accordingly, 100 na times 20 devices in parallel equals the 2 ua bias current of the current source 618 in FIG. 6.

Figure 8:
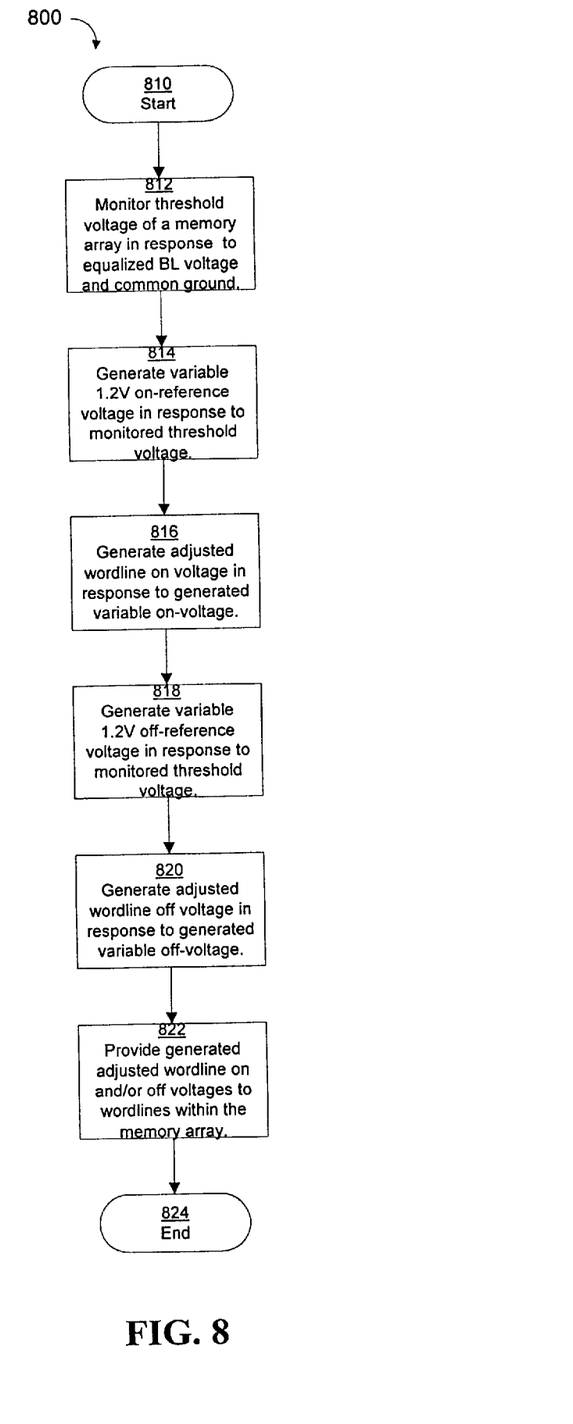
FIG. 8 shows a flow diagram for wordline voltage compensation in integrated memory circuits according to an exemplary embodiment of the present disclosure.

Turning now to FIG. 8, the reference numeral 800 generally indicates a flowchart for using wordline voltage compensation in integrated memory circuits. A start block 810 passes control to a function block 812, which monitors a threshold voltage of a memory array in response to an equalized bit line voltage and a common ground. The function block 812, in turn, passes control to a function block 814, which generates a variable 1.2V on-reference voltage in response to the monitored threshold voltage. The function block 814, in turn, passes control to a function block 816, which generates an adjusted wordline on voltage in response to the generated variable on-voltage. The function block 816, in turn, passes control to a function block 818, which generates a variable 1.2V off-reference voltage in response to the monitored threshold voltage. The function block 818, in turn, passes control to a function block 820, which generates an adjusted wordline off voltage in response to the generated variable off-voltage. The function block 820 passes control to a function block 822, which provides the generated adjusted wordline on and/or off voltages to wordlines within the memory array, and passes control to an end block 824.

In operation, the exemplary embodiment circuit enables both $V_{PP}$ and $V_{WLL}$ to track the sub-threshold current of the monitor devices. Thus, when the array $V_T$ increases or decreases, $V_{PP}$ and $V_{WLL}$ also change, keeping the maximum $V_{PP}$ to $V_{WLL}$ swing constant at 3.1 v, for example. The n-fet ("nf") array monitor devices are biased on the linear portion of the sub-$V_T$ slope such that the $I_{off}$ conduction is proportional to the nf array device $V_T$. As a result, $V_{PP}$ and $V_{WLL}$ track the nf array $V_T$, rather than the $I_{dsat}$ current.

The voltages track as follows: For a lower nf array $V_T$, and consequently a higher $I_{off}$ leakage current, $V_{WLL}$ shifts more negative to help reduce the $I_{off}$ leakage. Since the maximum swing is constant, $V_{PP}$ also decreases. However the lower nf array overdrive voltage does not reduce the $I_{dsat}$ current, because the $V_T$ is also lower by the same amount. In the opposite case, with a higher nf array $V_T$, and consequently a lower $I_{off}$ leakage current, $V_{WLL}$ shifts more positive. The more positive $V_{WLL}$ does not increase $I_{off}$ because of a corresponding increase in $V_T$. Since the $V_{WLL}$ to $V_{PP}$ swing is constant, $V_{PP}$ increases, compensating for the higher $V_T$ with an equal increase in the overdrive voltage.

Thus, the exemplary circuit solves the potential reliability problem by keeping the $V_{WLL}$ to $V_{PP}$ swing fixed at the maximum allowable difference. Second, $I_{off}$ leakage is decreased for a low nf array $V_T$ by setting $V_{WLL}$ more negative. In addition, write back and read performance is increased for high nf array $V_T$ by increasing $V_{PP}$. In a preferred embodiment, $V_{WLL}$ and $V_{PP}$ are limited by a min/max function so that they will not move more than plus and minus 200 mv from nominal.

It is to be understood that, because some of the constituent system components and methods depicted in the accompanying drawings may be implemented in firmware, the actual connections between the system components or the process function blocks may differ depending upon the manner in which the present disclosure is programmed. Given the teachings herein, one of ordinary skill in the pertinent art will be able to contemplate these and similar implementations or configurations of the present disclosure.

Although illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A wordline compensation circuit responsive to an array threshold voltage, the circuit comprising:

an array threshold voltage ("$V_T$") monitor;

a wordline on voltage ("$V_{pp}$") generator in signal communication with said threshold voltage monitor for providing a wordline on voltage responsive to a change in the monitored array threshold voltage;

a wordline off voltage ("$V_{WLL}$") generator in signal communication with said threshold voltage monitor for providing a wordline off voltage responsive to a change in the monitored array threshold voltage; and at least one of a wordline on reference voltage generator and a wordline off reference voltage generator in signal communication with said array threshold voltage monitor for providing at least one of a variable wordline on reference voltage ("$V_{PPREF}$") and a variable wordline off reference voltage ("$V_{WLLREF}$"), respectively, to at least one of said wordline on voltage generator and said wordline off voltage generator, respectively.

2. A wordline compensation circuit as defined in claim 1, further comprising at least one voltage limiter for maintaining each of the wordline on voltage and the wordline off voltage within a pre-selected tolerance of the respective nominal wordline on and wordline off voltages.

3. A wordline compensation circuit as defined in claim 1 wherein the difference between the wordline on voltage and the wordline off voltage is maintained at a pre-selected nominal maximum stress voltage.

4. A computing system for supporting a memory circuit having wordline compensation responsive to an array threshold voltage, the computing system comprising a memory circuit having a plurality of memory arrays, each memory array in signal communication with a plurality of wordlines for accessing individual memory cells within the memory array, each said memory array comprising:

an array threshold voltage ("$V_T$") monitor;

a wordline on voltage ("$V_{pp}$") generator in signal communication with said array threshold voltage monitor for providing a wordline on voltage responsive to a change in the monitored array threshold voltage;

a wordline off voltage ("$V_{WLL}$") generator in signal communication with said array threshold voltage monitor for providing a wordline off voltage responsive to a change in the monitored array threshold voltage; and at least one of a wordline on reference voltage generator and a wordline off reference voltage generator in signal communication with said array threshold voltage monitor for providing at least one of a variable wordline on reference voltage ("$V_{PPREF}$") and a variable wordline off reference voltage ("$V_{WLLREF}$") respectively, to at least one of said wordline on voltage generator and said word line off voltage generator, respectively.

5. A computing system as defined in claim 4, each said memory array further comprising at least one voltage limiter for maintaining each of the wordline on voltage and the wordline off voltage within a pre-selected tolerance of the respective nominal wordline on and wordline off voltages.

6. A computing system as defined in claim 4, wherein the difference between a wordline on voltage and a corresponding wordline off voltage is maintained at a pre-selected nominal maximum stress voltage.

7. A method for compensating each of a wordline on signal and a wordline off signal in correspondence with an array threshold signal, the method comprising:

monitoring an array threshold;

generating a wordline on signal responsive to the monitored array threshold signal;

generating a wordline off signal responsive to the monitored array threshold signal;

generating at least one of a variable wordline on reference signal and a variable wordline off reference signal, responsive to the monitored array threshold voltage signal; and generating at least one of the wordline on signal in response to the generated variable wordline on reference signal and the wordline off signal in response to the generated variable wordline off reference signal, respectively.

8. A method as defined in claim 7, further comprising limiting each of the wordline on signal and the wordline off signal within a pre-selected tolerance of the nominal wordline on and wordline off signals, respectively.

9. A method as defined in claim 7, further comprising maintaining the difference between a wordline on signal and a corresponding wordline off signal at a pre-selected nominal maximum stress level.

10. A wordline compensation circuit responsive to an array threshold signal, the circuit comprising:

monitoring means for monitoring an array threshold signal;

first generating means for generating a wordline on signal responsive to the monitored array threshold signal;

second generating means for generating a wordline off signal responsive to the monitored array threshold signal;

third generating means for generating at least one of a variable wordline on reference signal and a variable wordline off reference signal, responsive to the monitored array threshold voltage signal; and fourth generating means for generating at least one of the wordline on signal in response to the generated variable wordline on reference signal and the wordline off signal in response to the generated variable wordline off reference signal, respectively.

11. A wordline compensation circuit as defined in claim 10, further comprising signal limiting means for limiting each of the wordline on signal and the wordline off signal within a pre-selected tolerance of the nominal wordline on and wordline off signals, respectively.

12. A wordline compensation circuit as defined in claim 10, further comprising, difference maintaining means for maintaining the difference between a wordline on signal and a corresponding wordline off signal at a pre-selected nominal maximum stress level.

* * * * *